United States Patent
Miao et al.

(10) Patent No.: US 12,405,326 B2
(45) Date of Patent: Sep. 2, 2025

(54) EXPERIMENTAL APPARATUS AND METHOD FOR REGULATING AND CONTROLLING ZEEMAN TRANSITION OF MAGNETIC RESONANCE

(71) Applicant: LANZHOU INSTITUTE OF PHYSICS, Gansu (CN)

(72) Inventors: Peixian Miao, Gansu (CN); Yanchao Shi, Gansu (CN); Dayong Chen, Gansu (CN); Jiqing Lian, Gansu (CN); Jinhai Zhang, Gansu (CN); Jianxiang Wang, Gansu (CN); Shiyu Yang, Gansu (CN); Hao Feng, Gansu (CN); Yuhua Xiao, Gansu (CN); Hongwei Zhu, Gansu (CN); Hu Dai, Gansu (CN); Jun Yang, Gansu (CN); Jianhui Tu, Gansu (CN); Wei Yang, Gansu (CN); Jingzhong Cui, Gansu (CN); Jiang Chen, Gansu (CN); Zhidong Liu, Gansu (CN)

(73) Assignee: LANZHOU INSTITUTE OF PHYSICS, Gansu (CN)

( * ) Notice: Subject to any disclaimer, the term of this patent is extended or adjusted under 35 U.S.C. 154(b) by 127 days.

(21) Appl. No.: 18/551,239

(22) PCT Filed: Jul. 2, 2021

(86) PCT No.: PCT/CN2021/104324
§ 371 (c)(1),
(2) Date: Sep. 19, 2023

(87) PCT Pub. No.: WO2022/217761
PCT Pub. Date: Oct. 20, 2022

(65) Prior Publication Data
US 2024/0329168 A1    Oct. 3, 2024

(30) Foreign Application Priority Data
Apr. 16, 2021   (CN) .......................... 202110412374.4

(51) Int. Cl.
*G01R 33/26* (2006.01)

(52) U.S. Cl.
CPC .................................. *G01R 33/26* (2013.01)

(58) Field of Classification Search
CPC .. G01R 33/26; G01R 33/032; G01R 33/1215; G01R 33/24; G01R 33/02; G09B 23/181
See application file for complete search history.

(56) References Cited

U.S. PATENT DOCUMENTS

2014/0354275 A1* 12/2014 Sheng .................... G01R 33/26
                                                    324/244.1
2019/0250223 A1    8/2019 Palacios Laloy

FOREIGN PATENT DOCUMENTS

| CN | 101846965 A | 9/2010 |
|---|---|---|
| CN | 105445199 A | 3/2016 |

(Continued)

*Primary Examiner* — Rishi R Patel
(74) *Attorney, Agent, or Firm* — NKL Law; Allen Xue

(57) ABSTRACT

Provided are an experimental apparatus and method for regulating and controlling the Zeeman transition of magnetic resonance. The method includes: generating a constant background magnetic field by using a magnetic shielding cylinder, a background magnetic field coil, and a constant current source, and controlling a Larmor precession frequency corresponding to the background magnetic field to be equal to a frequency of a sinusoidal signal output by a radio frequency signal source; adjusting the amplitude of a signal output by a radio frequency signal source of a pump-probe atomic magnetometer to set a radio frequency signal to be a $\pi/2$ pulse or a $\pi$ pulse; and then controlling the radio frequency signal source to output a series of sinusoidal radio frequency pulse strings having the same initial phase. The Zeeman transition of magnetic resonance is regulated and controlled by adjusting the time interval between the radio frequency pulse signals.

8 Claims, 5 Drawing Sheets

(56) References Cited

FOREIGN PATENT DOCUMENTS

| CN | 107015172 A | 8/2017 |
| CN | 109541500 A | 3/2019 |
| CN | 110768097 A | 2/2020 |
| CN | 111308228 A | 6/2020 |
| CN | 112485732 A | 3/2021 |

* cited by examiner

EXPERIMENTAL APPARATUS AND METHOD FOR REGULATING AND CONTROLLING ZEEMAN TRANSITION OF MAGNETIC RESONANCE

TECHNICAL FIELD

The present invention relates to the technical field of quantum information, in particular to an experimental apparatus and method for regulating and controlling the Zeeman transition of magnetic resonance.

BACKGROUND

In 1913, a Danish physicist Bohr proposed a planetary orbit model for hydrogen atoms (an old quantum theory) and believed that quantum transition occurred randomly. Due to the radiation of energy during a circular motion of electrons, a planetary orbit model of atoms has an unstable structure. In 1926, Schrodinger proposed the Schrodinger equation and an electron cloud structure. A wave function $\Psi(x,y,z)$ is used to characterize a motion state of electrons, and a value of its modulus square $|\Psi|^2$ is used to represent the probability of electrons appearing somewhere outside a nucleus per unit volume, so an electron cloud is actually the distribution of $|\Psi|^2$ in space. In 1930, Dirac regarded the superposition of quantum states as a basic hypothesis of quantum mechanics, and since then, there has been a heated debate in the academic community about whether the basic hypothesis of quantum mechanics is valid and whether quantum mechanics is complete. In 1935, Einstein and Schrodinger raised doubts about the completeness of quantum mechanics with the "EPR paradox" and "Schrodinger cat", respectively, while Bohr made refutation with the observer effect. Looking back at the development history of physics, quantum mechanics is a statistical law obtained based on statistical experiments (such as blackbody radiation and atomic spectrum), and has successfully explained many statistical experiments. However, there is still controversy in the academic community about whether quantum transition is random or deterministic in a single quantum bit.

Since the beginning of the 21st century, the intersection of quantum physics and information science has produced a quantum information technology, of which a physical basis is the superposition of quantum states, quantum nonlocality and quantum non-cloning theorem. A necessary condition for the engineering application of the quantum information technology is that information is stored in quantum bits. However, the academic community has not yet answered the question of how to "write" and "read" a single quantum bit in experiments.

SUMMARY

In view of this, the present invention discloses an experimental apparatus and method for regulating and controlling the Zeeman transition of magnetic resonance. In the present invention, based on a two-level system of the Zeeman transition of magnetic resonance, an evolution process of a coherent atomic ensemble in a magnetic field is equivalent to evolution of an atom. The experimental conditions required for manipulating quantum transition are explained from the experimental details of manipulating the transition of magnetic resonance, and the experimental details that should be paid attention to in "writing" and "reading" of a single quantum bit in the future are analyzed. The present invention attempts to obtain a conclusion that quantum transition is deterministic, thereby demonstrating the feasibility of the quantum information technology and application thereof.

In the present invention, firstly, a constant background magnetic field is generated by using a magnetic shielding cylinder, a background magnetic field coil, and a constant current source, and a current output from the constant current source to a standard coil is adjusted by monitoring a Larmor precession frequency $f_0$ output by a pump-probe atomic magnetometer, so that a Larmor precession frequency $f_0$ corresponding to the background magnetic field is equal to a frequency $f$ of a sinusoidal signal output by a radio frequency signal source; secondly, a duration of a $\pi/2$ pulse or a $\pi$ pulse of a radio frequency signal is set by adjusting an amplitude of a signal output by the radio frequency signal source of the pump-probe atomic magnetometer; and then the radio frequency signal source is controlled to output a series of sinusoidal radio frequency pulse strings having the same initial phase, wherein a first radio frequency pulse signal is a $\pi/2$ pulse, a time interval between radio frequency pulse signals is set to be $\pi/f_0$ or $(m-0.5)/f_0$, and n and m are positive integers, and the Zeeman transition of magnetic resonance is regulated and controlled by adjusting the time interval between the radio frequency pulse signals. In an embodiment of the present invention, a combination of four sets of radio frequency field pulse strings is designed to achieve the regulating and controlling results of ↑↓↑↓↑↓↑↓, ↑↑↑↑↑↑↑↑, ↑↓↓↓↓↓↓↓ and ↑↑↓↓↑↑↓↓↑↑ (↑ represents that an atomic magnetic moment points to a positive direction of a z-axis, and ↓ represents that an atomic magnetic moment points to a negative direction of the z-axis). The embodiment of the present invention proves that quantum transition is a process, can be repeatedly manipulated, and is a deterministic conclusion.

Beneficial Effects (1) In the present invention, a z-axis transition signal and an x-axis internal state evolution signal during the Zeeman transition of magnetic resonance are simultaneously observed, while a microwave atomic clock experimental apparatus can only observe a signal similar to the z-axis transition signal in the present invention, and cannot observe a signal similar to the x-axis internal state evolution signal in the present invention.

(2) The method of the present invention can be regarded as a non-destructive measurement of a magnetic moment of a single atom. When expressions (1) and (2) are derived, most theories focus on a single atom. In a book of "Laser Cooling and Trapping of Atoms" edited by Mr. Wang Yiqiu (Peking University Press, 2007), it is pointed out in line 5 of paragraph 1 on page 58 that when a phase of a wave function of a group of atoms is consistent (or atomic states are coherent), this group of atoms can be regarded as one. If a relaxation mechanism is not taken into account, the states of a group of atoms 100% polarized in the present invention are coherent, and because the pumping of circularly polarized light and the action of a radio frequency field make magnetic moments of these atoms precess uniformly, this group of atoms can be regarded as one; and at the same time, it is also pointed out that an experimental method of changing the polarizability of this group of atoms by changing the intensity of pump light in an experiment does not affect an experimental conclusion of an embodiment of the present invention. In the present invention, far detuned detection light is used in the x-axis and z-axis directions to detect this group of atoms, and the damage of the detection light to an atomic polarization state can be almost ignored.

(3) In the present invention, from an experiment of regulating and controlling the Zeeman transition of magnetic resonance of rubidium atoms, it is concluded that quantum transition is a process, can be manipulated repeatedly, and is deterministic. The Zeeman transition of two-level magnetic resonance belongs to a quantum transition. In the invention, the experimental results are predicted well with a classical theory, and it has been proved in the history of physics that the description of the transition of magnetic resonance by the classical theory and the Schrodinger equation is equivalent (references: Rabi I I, Ramsey N F, Schwinger J. Use of rotating coordinates in magnetic resonance problems. Reviews of Modern Physics, 1954, 26 (2): 167-171). A radio frequency field, a microwave field and a light field all belong to electromagnetic waves, and an interaction between atoms and these physical fields should have similar physical laws. The experimental results of the embodiment of the present invention are analogized to the "write" and "read" operations of information in quantum bits. Based on the certainty of quantum transition, it is indicated that two physical foundations of the superposition of quantum states and quantum nonlocality are controversial when describing single or multiple quantum bits. The physical principles, technical solutions, and experimental results of the embodiment described in the invention have disruptive significance in basic physics, and have the potential to be promoted in college physics experiment teaching.

BRIEF DESCRIPTION OF THE DRAWINGS

Wherein, 1—magnetic shielding cylinder, 2—background magnetic field coil, 3—radio frequency magnetic field coil, 4—rubidium cell heating module, 5—rubidium cell, 6—radio frequency signal source, 7—constant current source, 8—z-axis circularly polarized pump laser (right-handed), 9—z-axis polarization detection laser, and 10—x-axis polarization detection laser. FIG. 1 shows the coordinate system definition of the experimental apparatus.

In FIG. 2, when z-axis right-handed circularly polarized pump laser with a specific duration polarizes an atomic magnetic moment to a direction parallel to an external magnetic field, the atomic magnetic moment points to a position A in image (a) in a Bloch sphere; after a π/2 pulse is applied by a radio frequency field, the atomic magnetic moment points to a position B in the image (a) in the Bloch sphere; when the atomic magnetic moment freely precesses at an angle of 2nπ in the external magnetic field, n being a positive integer, the atomic magnetic moment points to a position C in image (b) in the Bloch sphere, and the position B coincides with the position C, and then, after a π/2 pulse is applied by the radio frequency field, the atomic magnetic moment points to a position D in image (c) in the Bloch sphere; and when the atomic magnetic moment freely precesses at an angle of (2m−1)π in the external magnetic field, m being a positive integer, the atomic magnetic moment points to a position C' in image (d) in the Bloch sphere, and then, after a π/2 pulse is applied by the radio frequency field, the atomic magnetic moment points to a position D' in image (e) in the Bloch sphere, and the position A coincides with the position D'. An evolution process of the atomic magnetic moment from A→B→C→D indicates that complete Zeeman transition of magnetic resonance of rubidium atoms is completed by using a separated oscillating field; an evolution process of the atomic magnetic moment from A→B→C'→D' indicates that the Zeeman transition of magnetic resonance of rubidium atoms does not occur with the separated oscillating field; and the frequency, amplitude, and initial phase of π/2 pulses in the radio frequency field in images (a), (c), and (e) are the same. In the embodiment of the present invention, for the convenience of observing the regulating and controlling effect of the Zeeman transition of magnetic resonance, a series of radio frequency field pulse strings are set, and the π/2 pulses in the radio frequency field in images (c) and (e) are replaced with π pulses. A radio frequency π pulse signal causes the atomic magnetic moment to finally return to an x-y plane, and the Zeeman transition of magnetic resonance is regulated and controlled by repeating the physical processes in images (b) and (c), or images (d) and (e).

FIG. 3A shows the differential signal detected on the z-axis of the experimental apparatus when the radio frequency field is continuously applied for 30 ms, with one working period of 100 ms. Firstly, rubidium atoms are polarized by z-axis right-handed circularly polarized laser for 30 ms, so that a magnetic moment of the rubidium atoms is parallel to the direction of the external magnetic field; then a pump light is turned off, and meanwhile, radio frequency field pulse strings are applied for 30 ms. A projection vector of the atomic magnetic moment in a z-axis direction is detected and recorded by z-axis polarized light red-detuned by 8 GHz; and FIG. 3B shows the result that a projection vector of the atomic magnetic moment in an x-axis direction is detected and recorded by x-axis polarized light red-detuned by 8 GHz, wherein an experimental operation process is the same as that in FIG. 3A.

FIGS. 4A to 4D are the regulating and controlling results of ↑↓↑↓↑↓↑↓, ↑↑↑↑↑↑↑↑↑↑, ↑↓↓↓↓↓↓↓↓ and ↑↑↓↓↑↑↓↓↑↑ (↑ represents that an atomic magnetic moment points to a positive direction of a z-axis, and ↓ represents that an atomic magnetic moment points to a negative direction of the z-axis) realized according to the physical idea in FIG. 2, respectively, wherein a time interval between radio frequency pulse signals is shown in Table 1.

In FIG. 5, the experimental results of 5 repeated regulating and controlling of ↑↑↑↓↓↑↑↓↓↑↑ are shown, wherein an experimental operation process is the same as that in FIG. 4D.

In FIGS. 6A and 6B, a time interval between radio frequency pulse signals in FIGS. 6A and 6B is the same as that in FIG. 4D, and a phase difference between a pulse sinusoidal signal and a continuous sinusoidal signal is defined as $\theta_k$, wherein an initial phase of all radio frequency pulse signals in the FIG. 6A is set to be zero, and the regulating and controlling result is ↑↑↓↓; when $|\theta_{k-1}-\theta_k|=\pi$, a time interval between a k−1th radio frequency pulse signal and a kth radio frequency pulse signal is 0.55 ms, and a kth radio frequency π pulse stops and reverses the evolution process of the transition of two-level magnetic resonance; and when $|\theta_{k-1}-\theta_k|=0$, the time interval between the k−1th radio frequency pulse signal and the kth radio frequency pulse signal is 0.50 ms, and the kth radio frequency π pulse completes the complete evolution process of the transition of two-level magnetic resonance. An initial phase of radio frequency pulse signals in FIG. 6B is specifically related to the time interval between the radio frequency pulse signals, which is either zero or π, and the regulating and controlling result is ↑↓↑↓; and for all radio frequency pulse strings, $\theta_k=0$, and compared with FIG. 6A, it can be seen that the regulating and controlling effect of stopping and reversing of regulating and controlling the transition of magnetic resonance disappears. The experimental results indicate that the condition that all sinusoidal radio frequency pulse signals have the same initial phase is a necessary condition for regulating and controlling the Zeeman transition of magnetic resonance.

DETAILED DESCRIPTION

Figure 1:
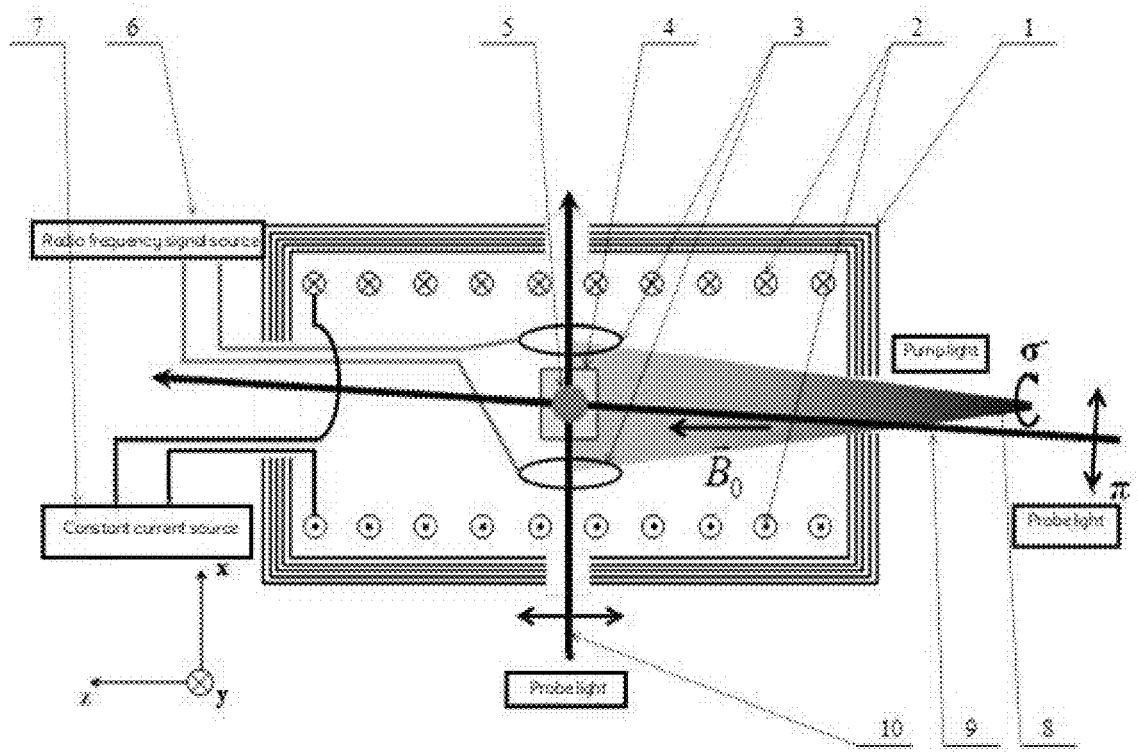
FIG. 1 is a schematic diagram of an experimental apparatus for regulating and controlling the Zeeman transition of magnetic resonance according to the present invention.

The present invention will be described in detail below with reference to the accompanying drawings and embodiments.

The present invention provides an experimental apparatus and method for regulating and controlling the Zeeman transition of magnetic resonance. The experimental apparatus for regulating and controlling the Zeeman transition of magnetic resonance mainly includes a background magnetic field generating component, a pump-probe atomic magnetometer, and a z-axis polarized light detection component.

The background magnetic field generating component includes a magnetic shielding cylinder 1, a background magnetic field coil 2, and a constant current source 7; wherein the magnetic shielding cylinder 1 is mainly configured to shield a geomagnetic field; the background magnetic field coil 2 is axially symmetrically placed inside the magnetic shielding cylinder 1, and the constant current source 7 applies a constant current to the background magnetic field coil 2 to generate a uniform and stable background magnetic field inside the magnetic shielding cylinder 1 in an axial direction; preferably, the magnetic shielding cylinder 1 can be cylindrical in shape, with an internal size of 100 500 mm×700 mm or larger, and if an axial size of the magnetic shielding cylinder 1 is increased, the measurement results will be better; the background magnetic field coil 2 matched with the magnetic shielding cylinder 1 can generate a uniform background magnetic field with a magnetic field gradient of less than 1% in an area of a rubidium cell 5 of the pump-probe atomic magnetometer to ensure the optimal working conditions of the pump-probe atomic magnetometer; and the constant current source 7 can use a 6.5-bit commercial digital current source.

The pump-probe rubidium atomic magnetometer is configured to measure a magnetic field at a rubidium cell, and also to control sinusoidal radio frequency pulse strings output by a radio frequency signal source thereof to regulate and control the Zeeman transition of magnetic resonance; the composition and working principle of the pump-probe rubidium atomic magnetometer can be found in the authorized invention patent "Rubidium atomic magnetometer and magnetic field measurement method thereof" (having an application number: CN201710270545.8), with a measurement range of 100 nT to 100000 nT; for the pump-probe rubidium atomic magnetometer in Embodiment 1 and FIG. 1 of the present invention, a radio frequency magnetic field coil 3, a rubidium cell heating module 4, the rubidium cell 5, a radio frequency signal source 6, z-axis circularly polarized pump laser 8, and x-axis polarization detection laser 10 are only listed; and the rubidium cell 5 is located in a geometric center of the background magnetic field coil 2. The z-axis circularly polarized pump laser 8 is circularly polarized pump laser that polarizes rubidium atoms in a rubidium cell of a pump-probe atomic magnetometer along a z axis, causing a magnetic moment of the rubidium atoms to be parallel or anti-parallel to the direction of an external magnetic field in the patent CN201710270545.8. This embodiment takes right-handed circularly polarized pump laser as an example for description of regulation and control. The x-axis polarization detection laser 10 is linear polarization detection laser perpendicular to the direction of the external magnetic field in the patent CN201710270545.8.

For the z-axis polarized light detection component, z-axis polarization detection laser 9 is only listed in FIG. 1, and the z-axis polarized light detection component is configured to differentially detect a signal of the Zeeman transition of magnetic resonance. Referring to an optical path structure of x-axis polarization detection laser in the patent CN201710270545.8, components such as a polarization beam-splitting prism, a photodetector and a differential amplification circuit are designed, and the measured signals are input into a data acquisition card and a computer to complete the acquisition of z-axis polarization differential detection signals. Preferably, in order to reduce the impact of z-axis right-handed circularly polarized pump laser on the z-axis detection signals, the z-axis right-handed circularly polarized pump laser 8 can use a divergent beam of less than 10° in FIG. 1 to irradiate the rubidium cell 5.

A frequency of the z-axis right-handed circularly polarized pump laser of the pump-probe rubidium atomic magnetometer is locked to D1 line transition of a $^{87}$Rb atom (i.e., $5^2S_{1/2} \rightarrow 5^2P_{1/2}$), and a frequency of x-axis and z-axis polarization detection lasers is red-detuned by 3 GHz to 10 GHz compared with a frequency of the pump laser, and generally, the x-axis and z-axis polarization detection lasers come from the same laser.

In combination with a classical physical image of atomic magnetic moment precession in the external magnetic field (referring to FIG. 2), a Larmor precession frequency $f_0$ corresponding to the background magnetic field is set to be equal to a frequency f of a sinusoidal signal output by the radio frequency signal source; the rubidium atoms in the rubidium cell are polarized by the z-axis right-handed circularly polarized pump laser of the pump-probe rubidium atomic magnetometer, so that the magnetic moment of the rubidium atoms is parallel to the direction of the external magnetic field; by adjusting the amplitude of a signal output by the radio frequency signal source, a radio frequency signal is controlled to be a π/2 pulse or a π pulse, and a pulse time interval between radio frequency pulse signals is controlled by controlling the opening or closing of output of the radio frequency signal source; all radio frequency pulse signals used for regulating and controlling the Zeeman transition of magnetic resonance have the same initial phase; and the Zeeman transition of magnetic resonance is regulated and controlled by adjusting the pulse time interval between the radio frequency pulse signals. Specifically, a duration $t_{\pi/2}$ of the π/2 pulse of the radio frequency signal is set to conform to an expression: $f_0 \times t_{\pi/2}=i$, i being a positive integer; a first radio frequency pulse signal for regulating and controlling the Zeeman transition of magnetic resonance is a π/2 pulse which excites an atomic magnetic moment to precess into an x-y plane; an atomic magnetic moment in a time interval between two radio frequency π/2 pulse signals freely precesses around the background magnetic field by 2nπ or (2m−1) π radians, wherein n and m are positive integers, and the time interval is π/$f_0$ or (m−0.5)/$f_0$; when the time interval between two radio frequency π/2 pulse signals is π/$f_0$, a second π/2 pulse completes complete Zeeman transition of magnetic resonance; when the time interval between two radio frequency π/2 pulse signals is (m−0.5)/$f_0$, the second π/2 pulse stops and reverses the Zeeman transition of magnetic resonance; the two π/2 pulses and the time interval between the two π/2 pulses constitute a basic unit of regulating and controlling the transition of magnetic resonance; when the atomic magnetic moment is in the x-y plane, a radio frequency π pulse signal causes the atomic magnetic moment to finally return to the x-y plane, a radio frequency pulse within a first ½ duration of a radio frequency π pulse can be considered as a second π/2 pulse of a previous basic unit of regulating and controlling the transition of magnetic resonance, and a radio frequency pulse within a last ½ duration of the radio frequency π pulse can be considered as a first π/2 pulse of a latter basic unit of regulating and controlling the transition of magnetic resonance, and the expression $f_0 \times t_{\pi/2}$=i causes an initial phase of two radio frequency π/2 pulses decomposed by the radio frequency π pulse to be the same; and the Zeeman transition of magnetic resonance is regulated and controlled by adjusting the pulse time interval between the radio frequency pulse signals.

A reference {Yang Bao, Miao Peixian, Shi Yanchao, et al., Theoretical and Experimental Studies on Classic Physical Picture of Two-Level Magnetic Resonance [J]. China Laser, 2020, 47 (10): 1012001.} provides a preliminary derivation process for x-axis magnetic resonance signals of the pump-probe atomic magnetometer, and after introducing coordinate system transformation, when a frequency f of a radio frequency field is equal to the Larmor precession frequency $f_0$, expressions for differential detection signals $V_{x-signal}$ and $V_{z-signal}$ in the x-axis and z-axis directions are as follows:

$$V_{x-signal} = A\mu \sin(\gamma B_{rf} t)\sin(2\pi f_0 t - \delta) \times e^{-t/T_2} \qquad (1)$$

$$V_{z-signal} = D\mu \cos(\gamma B_{rf} t) \times e^{-t/T_2} \qquad (2)$$

wherein A and D are proportionality coefficients, μ is an atomic magnetic moment of a single atom, γ is a gyromagnetic ratio of a rubidium atom, $B_{rf}$ is an amplitude of a radio frequency rotating field in an x-y plane, $f_0$ is a Larmor precession frequency, and is related to a constant magnetic field $B_0$, δ is an angle of a rotational coordinate system at an initial time relative to a laboratory coordinate system (related to an initial phase of the radio frequency field), and $T_2$ is the relaxation time of the macroscopic magnetization intensity of an atomic ensemble. The theoretical derivation process of the expressions (1) and (2) is not detailed in the present invention.

Under the condition of magnetic resonance (f=$f_0$), according to the effect of applying a π/2 pulse by the radio frequency field, the amplitude $B_{rf}$ of the radio frequency field and a duration $t_{\pi/2}$ of the π/2 pulse satisfy a relational expression:

$$\gamma B_{rf} t_{\pi/2} = \pi/2 \qquad (3)$$

Because the amplitude of the sinusoidal signal output by the radio frequency signal source 6 determines the magnitude of $B_{rf}$, a duration of the π/2 pulse or the π pulse of the radio frequency signal in the experiment is determined by adjusting the amplitude of the signal output by the radio frequency signal source. A duration corresponding to an envelope in an x-axis differential detection signal is a duration of the π pulse, and half of this duration is a duration of the π/2 pulse.

An experimental method for regulating and controlling the Zeeman transition of magnetic resonance based on the above experimental device of the present invention is as follows:

Step 1, setting the pump-probe atomic magnetometer in a magnetic field measurement mode; setting a frequency of a radio frequency pulse signal output by the radio frequency signal source in the pump-probe atomic magnetometer to be f, and an initial phase of the radio frequency pulse signal output by the radio frequency signal source in the pump-probe atomic magnetometer to be a fixed value; and fine-tuning parameters of the background magnetic field generating component by monitoring a Larmor precession frequency $f_0$ output by the pump-probe atomic magnetometer, so that the Larmor precession frequency $f_0$ corresponding to the background magnetic field is strictly equal to the frequency f of the radio frequency pulse signal;

Step 2, setting a duration of a first radio frequency pulse signal output by the radio frequency signal source in the pump-probe atomic magnetometer to be longer than a preset π pulse duration, adjusting an amplitude of a sinusoidal signal output by the radio frequency signal source in the pump-probe atomic magnetometer, and determining a duration of a π/2 pulse or a π pulse corresponding to the transition of magnetic resonance by observing an x-axis differential detection signal, so that a duration $t_{\pi/2}$ of the π/2 pulse of the radio frequency signal conform to an expression: $f_0 \times t_{\pi/2}$=i, wherein a duration corresponding to an envelope is a duration of the π pulse; and Step 3, setting the radio frequency signal source in the pump-probe atomic magnetometer to output a series of radio frequency pulse strings, wherein a first radio frequency pulse signal output by the radio frequency signal source is a π/2 pulse after z-axis circularly polarized pump laser in the pump-probe atomic magnetometer is turned off, and a time interval between two radio frequency pulses is n/$f_0$ or (m−0.5)/$f_0$, and observing the Zeeman transition of magnetic resonance by using the z-axis polarized light detection component; and adjusting a pulse time interval between radio frequency pulse signals to regulate and control the Zeeman transition of magnetic resonance.

The experimental method for regulating and controlling the Zeeman transition of magnetic resonance is described in detail below in connection with Embodiment 1, wherein a frequency of the transition of magnetic resonance is set to be 10 kHz.

Embodiment 1

Step 1, a pump-probe atomic magnetometer is set in a magnetic field measurement mode; a frequency of a radio frequency pulse signal output by a radio frequency signal source in the pump-probe atomic magnetometer is set to be 10 kHz, and an initial phase of the radio frequency pulse signal output by the radio frequency signal source in the pump-probe atomic magnetometer is set to be zero; and a current output from a constant current source 7 to a background magnetic field coil 2 is fine-tuned by monitoring a Larmor precession frequency output by the pump-probe atomic magnetometer, so that the Larmor precession frequency corresponding to a background magnetic field is strictly equal to 10 kHz.

Figure 3A:
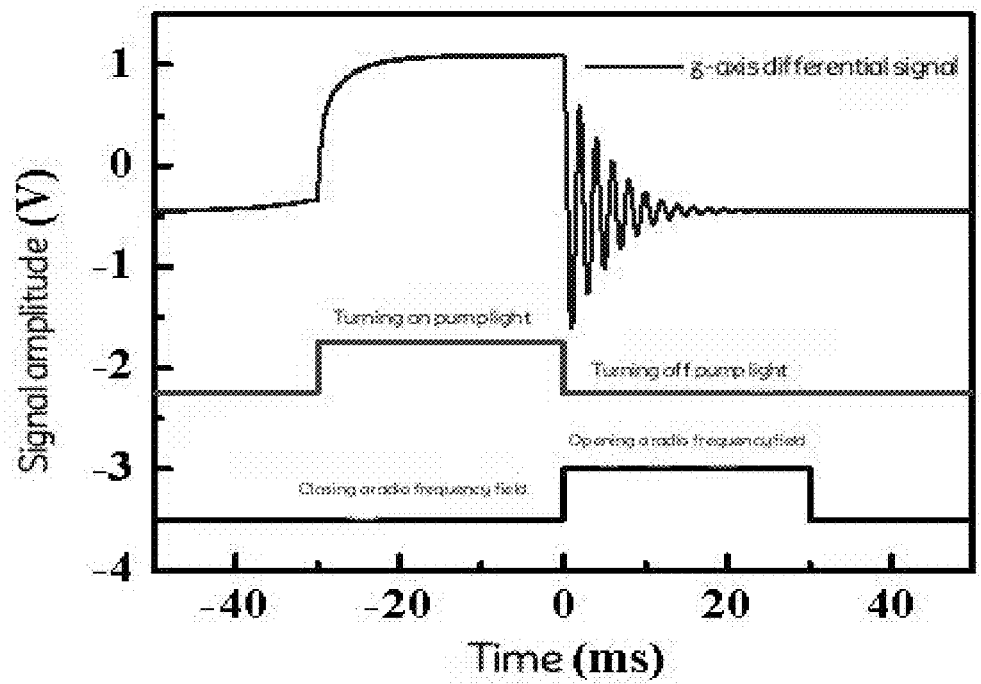
FIGS. 3A and 3B show differential signals detected on a z-axis and an x-axis of the experimental apparatus when a radio frequency field is continuously applied for 30 ms.
Figure 3B:
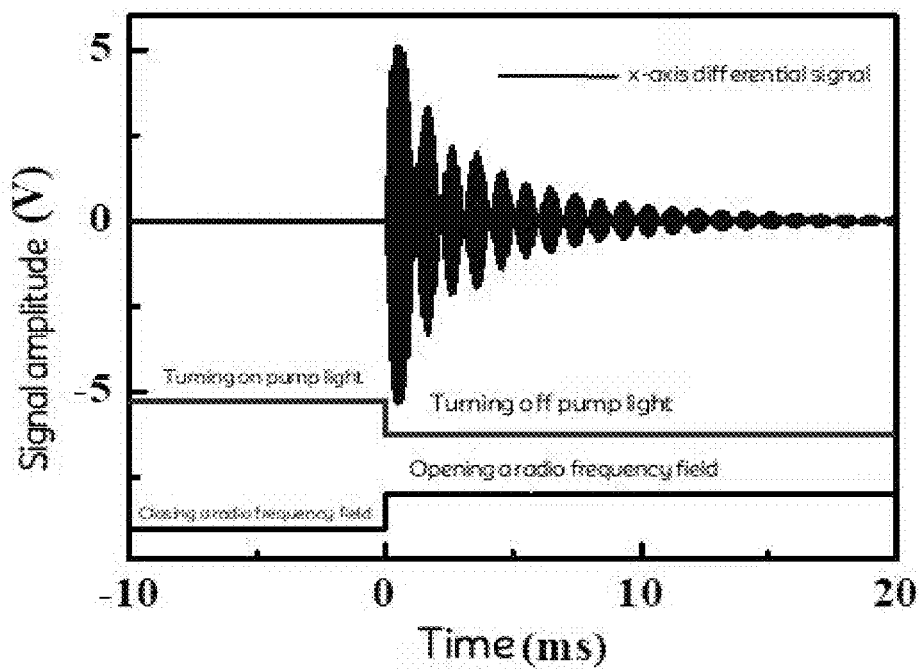
Figure 4A:
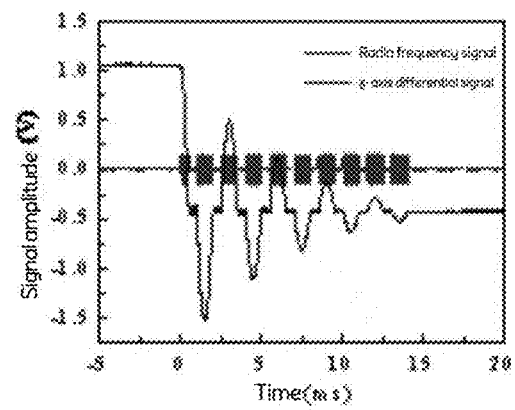
FIGS. 4A-4D show the experimental results of regulating and controlling the Zeeman transition of magnetic resonance.
Figure 4B:
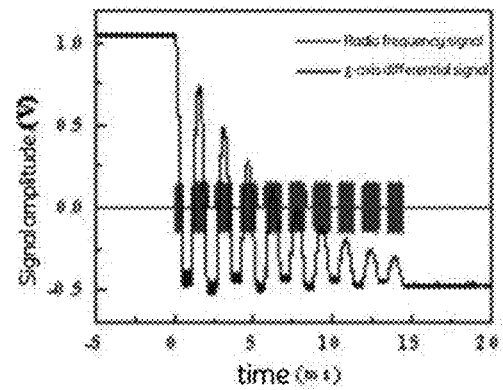
Figure 4C:
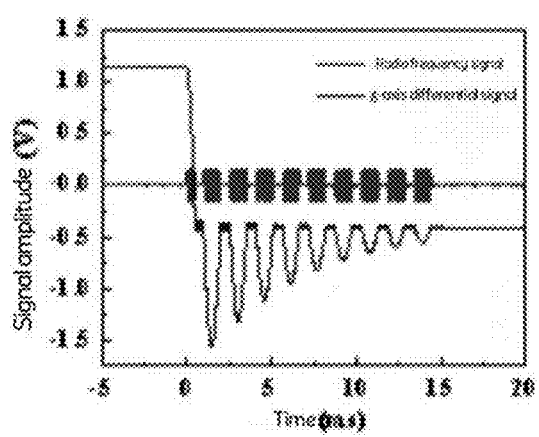
Figure 4D:
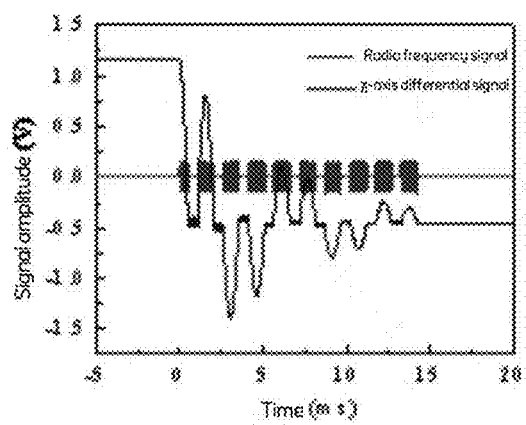
Figure 5:
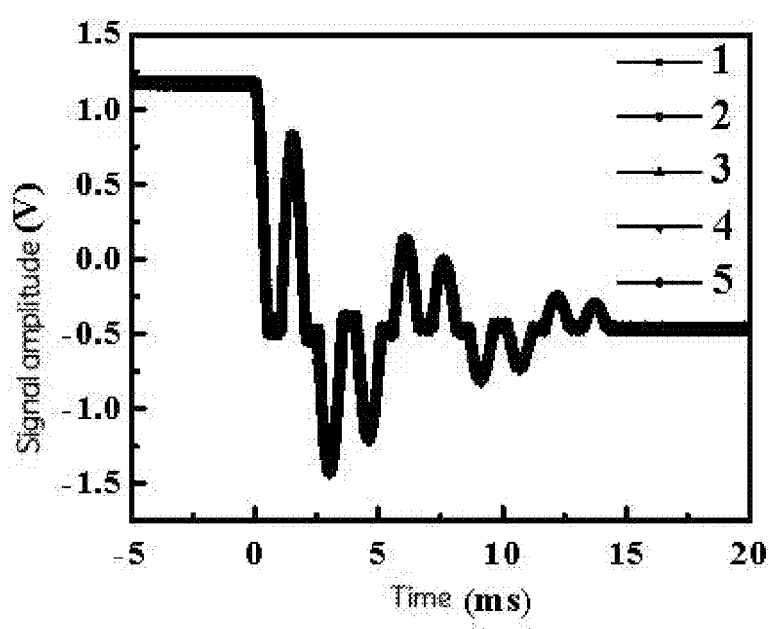
FIG. 5 shows the repeatability verification of an experiment of regulating and controlling the Zeeman transition of magnetic resonance.

Step 2, A duration of a first radio frequency pulse signal output by the radio frequency signal source in the pump-probe atomic magnetometer is set to be 30 ms, an amplitude of a sinusoidal signal output by the radio frequency signal source in the pump-probe atomic magnetometer is adjusted, a duration of a π pulse corresponding to the transition of magnetic resonance is set by observing a duration corresponding to an envelope in an x-axis differential detection signal, and when i=5, a duration of a π/2 pulse is 0.50 ms, and a duration of a π pulse is 1.00 ms; and FIGS. 3A and 3B show differential signals detected on a z-axis and an x-axis of the experimental apparatus when a radio frequency field is continuously applied for 30 ms.

Figure 2:
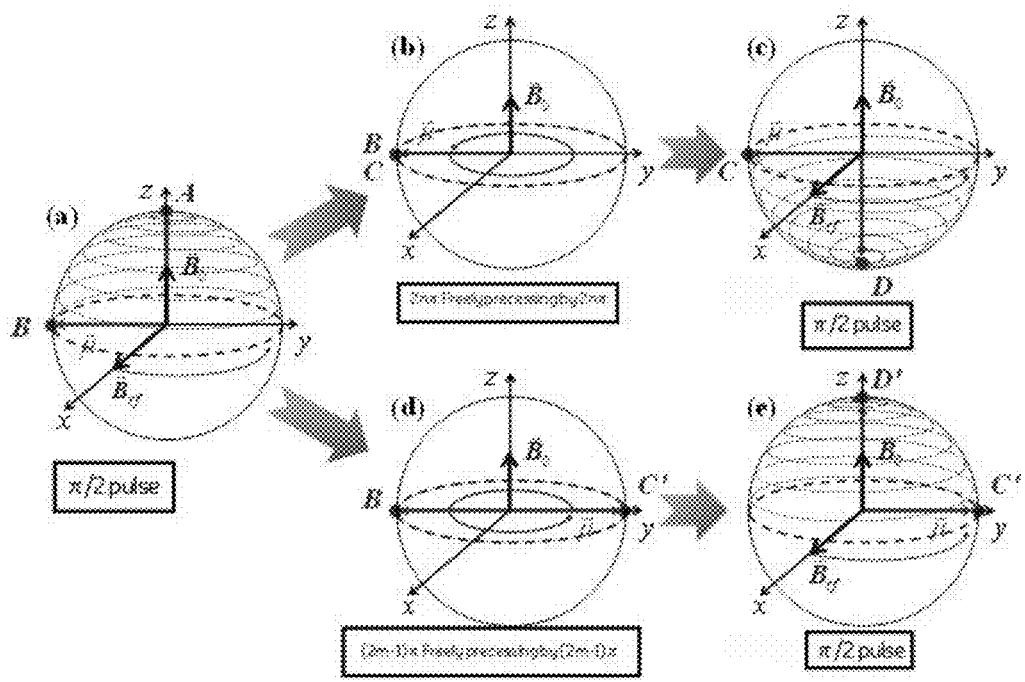
FIG. 2 is a schematic diagram of a principle of regulating and controlling the Zeeman transition of magnetic resonance according to the present invention.

Step 3, The radio frequency signal source in the pump-probe atomic magnetometer is set to output a series of radio frequency pulse strings; after z-axis right-handed circularly polarized pump laser is turned off, 10 radio frequency field pulse strings are turned on, and all initial phases are zero, wherein a first pulse of the radio frequency field is a π/2 pulse (0.5 ms) of the transition of magnetic resonance, and the last nine pulses of the radio frequency field are π pulses (1 ms), wherein a time interval between 9 radio frequency pulse strings is shown in Table 1 (in ms); when $f_0$=10 kHz, n=5, and m=6, a time interval between radio frequency pulse strings corresponding to $n/f_0$ or $(m-0.5)/f_0$ is 0.50 ms or 0.55 ms; a duration corresponding to the condition that an atomic magnetic moment precesses around a magnetic field $B_0$ for one period is 0.1 ms, so the atomic magnetic moment precesses by 10 π radians within 0.5 ms, and the atomic magnetic moment precesses by 11 π radians within 0.55 ms; and the Zeeman transition of magnetic resonance is observed by using a z-axis polarized light detection component, and the regulating and controlling results of ↑↓↑↓↑↓↑↓↑↓, ↑↑↑↑↑↑↑↑↑↑, ↑↓↓↓↓↓↓↓↓↓ and ↑↑↓↓↑↑↓↓↑↑ (↑ represents that the atomic magnetic moment points to a positive direction of a z-axis, and ↓ represents that the atomic magnetic moment points to a negative direction of the z-axis) are realized according to the physical idea in FIG. 2, as shown in FIGS. 4A-4D.

man transition of magnetic resonance. This comparative experiment shows that the condition that all radio frequency pulses have the same initial phase is a necessary condition for realizing the experimental results of regulating and controlling the Zeeman transition of magnetic resonance in FIGS. 4A-4D.

The following conclusions are obtained by analyzing the experiment of regulating and controlling the Zeeman transition of magnetic resonance of rubidium atoms in Embodiment 1 (FIGS. 3A to 6B): quantum transition is a process, can be repeatedly manipulated, and is a deterministic conclusion, and the importance of matching a precession phase of the atomic magnetic moment with a phase of an electromagnetic wave in the transition of magnetic resonance is pointed out. In the present invention, based on a two-level system of the Zeeman transition of magnetic resonance, an evolution process of a coherent atomic ensemble in a magnetic field is equivalent to evolution of an atom, and next, the experimental conditions required for manipulating quantum transition are explained from the experimental details of manipulating the transition of magnetic resonance. Analogous to the "write" and "read" operations of information in quantum bits, the π/2 pulse or the π pulse of the radio frequency signal in the present invention is called "write" information, and the detection of far detuned linear polarization detection light is called "read" information. In classical physical images, the direction of the atomic magnetic moment traverses a solid angle in a three-dimensional space during the precession evolution process. When the atomic magnetic moment precesses to the x-y plane, a projection vector of the atomic magnetic moment in the z-axis direction is zero; in the concept of quantum mechanics, assuming that two energy steady states of the atomic magnetic moment along the z-axis (a quantization axis) are $|\uparrow\rangle$ and $|\downarrow\rangle$, a quantum superposition state can be written as $|\Psi\rangle=a|\uparrow\rangle+b|\downarrow\rangle$, and when the quantum superposition state corresponds to the classical physical image in which the atomic magnetic moment precesses into the x-y plane, it is believed that $a=b=\sqrt{2}/2$ in the quantum mechanics, and the measurement process leads to the collapse of a wave function, so that a probability that the atomic magnetic moment is in both energy steady states of $|\uparrow\rangle$ and $|\downarrow\rangle$ is ½. However, the description of the "measurement" process in quantum mechanics in a textbook is relatively vague, and does not correspond to the experimental details of the "measurement" operation, such as the frequency, amplitude, and phase information of electromagnetic waves used for "measure-

TABLE 1

Time interval between radio frequency pulse strings (in ms)

| Regulating and controlling results | Time interval | | | | | | | | |
|---|---|---|---|---|---|---|---|---|---|
| | $\Delta t_1$ | $\Delta t_2$ | $\Delta t_3$ | $\Delta t_4$ | $\Delta t_5$ | $\Delta t_6$ | $\Delta t_7$ | $\Delta t_8$ | $\Delta t_9$ |
| ↑↓↑↓↑↓↑↓↑↓ | 0.50 | 0.50 | 0.50 | 0.50 | 0.50 | 0.50 | 0.50 | 0.50 | 0.50 |
| ↑↑↑↑↑↑↑↑↑↑ | 0.55 | 0.55 | 0.55 | 0.55 | 0.55 | 0.55 | 0.55 | 0.55 | 0.55 |
| ↑↓↓↓↓↓↓↓↓↓ | 0.5 | 0.55 | 0.55 | 0.55 | 0.55 | 0.55 | 0.55 | 0.55 | 0.55 |
| ↑↑↓↓↑↑↓↓↑↑ | 0.55 | 0.50 | 0.55 | 0.50 | 0.55 | 0.50 | 0.55 | 0.50 | 0.55 |

Figure 6A:
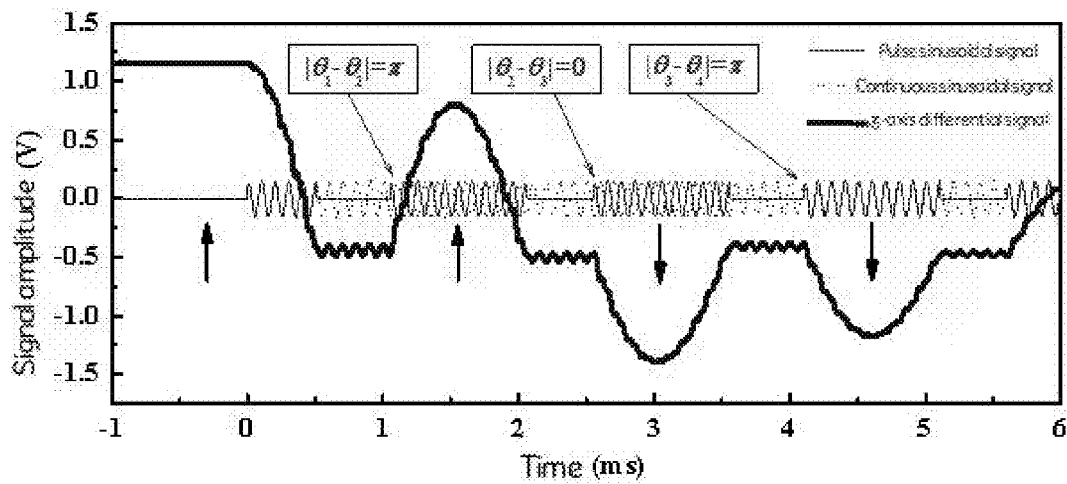
FIGS. 6A and 6B show the effect of an initial phase of radio frequency pulse strings on the experimental results of regulating and controlling the Zeeman transition of magnetic resonance.
Figure 6B:
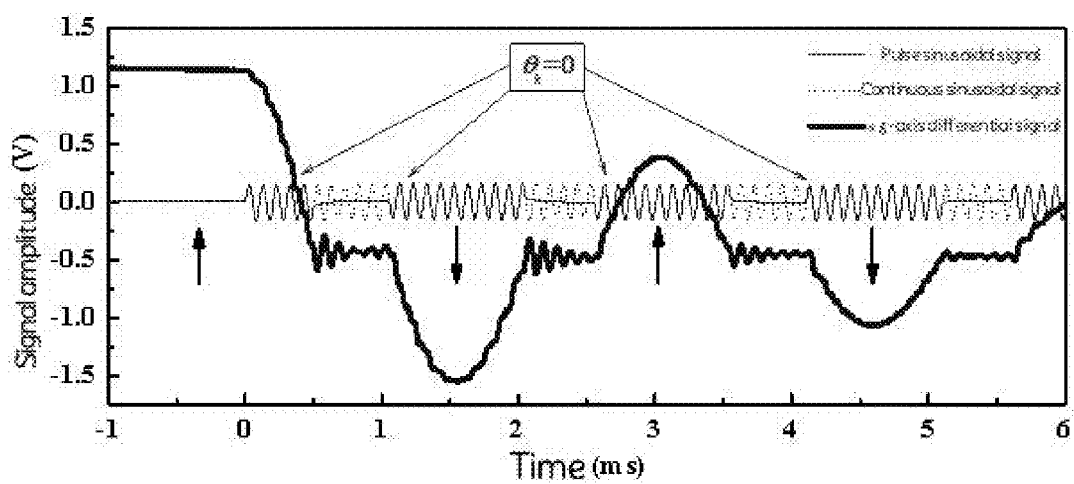

The above steps achieve the expected experimental results of regulating and controlling the Zeeman transition of magnetic resonance. In the step 3, the initial phases of radio frequency pulses output by the radio frequency signal source are set to be zero. FIGS. 6A and 6B show the effect of an initial phase of radio frequency field pulse strings on the experimental results of regulating and controlling the Zeement". The detection of the far detuned linear polarization detection light in the present invention should be a "measurement" process, but the physical process of wave function collapse is not observed in the experiment by this almost non-destructive detection method. If the local "write" process of the π/2 pulse or the π pulse of the radio frequency signal is regarded as the "measurement" process in quantum mechanics, considering that the "measurement" process of the radio frequency pulse strings is deterministic, it will be concluded that there is no quantum superposition state in a single quantum bit. From the perspective of future applications of the quantum information technology, the local "write" and local "read" operations of the single quantum bit should comply with certainty, and only in this way can information be accurately stored and read. When people accept this local certainty, the physical concept of long-distance quantum entanglement conflicts with the local certainty of the single quantum bit, because the local evolution process of one quantum bit cannot affect another quantum bit in the distance, and the evolution of the physical properties of another quantum bit is related to a local physical field where it is located, that is, local realism should be more in line with the laws of physics. Quantum mechanics is a statistical law obtained based on statistical experiments (such as blackbody radiation and atomic spectrum). Applying the basic concepts of quantum mechanics to the so-called single quantum bit or multiple quantum bits is not accurate, and may even lead to wrong or contradictory conclusions.

In summary, Embodiment 1 is only a preferred embodiment of the present invention and is not intended to limit the scope of protection of the present invention. Any modifications, equivalent replacements, improvements, etc. made within the spirit and principle of the present invention shall be included within the scope of protection of the present invention.

The invention claimed is:

1. An experimental apparatus for regulating and controlling a Zeeman transition of magnetic resonance, comprising: a background magnetic field generating component, a pump-probe atomic magnetometer, and a z-axis polarized light detection component;
    wherein the background magnetic field generating component is configured to generate a uniform and stable background magnetic field along a z-axis;
    the z-axis polarized light detection component is configured to detect a signal of the Zeeman transition of magnetic resonance;
    a pump-probe atomic magnetometer is located at the center of a background magnetic field generated by the background magnetic field generating component, and is configured to measure a magnetic field at a rubidium cell;
    a radio frequency signal is controlled to be a $\pi/2$ pulse or a $\pi$ pulse by controlling an amplitude of a signal output by a radio frequency signal source of the pump-probe atomic magnetometer, a pulse time interval between radio frequency pulse signals is controlled by controlling an opening or closing of output of the radio frequency signal source, and the Zeeman transition of magnetic resonance is regulated and controlled by adjusting the pulse time interval between the radio frequency pulse signals;
    wherein a Larmor precession frequency $f_0$ corresponding to the background magnetic field is equal to a frequency f of a sinusoidal signal output by the radio frequency signal source; all radio frequency pulse signals used for regulating and controlling the Zeeman transition of magnetic resonance have the same initial phase; a duration $t_{\pi/2}$ of the $\pi/2$ pulse of the radio frequency signal is set to conform to an expression: $f_0 \times t_{\pi/2} = i$, i being a positive integer; a first radio frequency pulse signal is a $\pi/2$ pulse, and this pulse signal excites an atomic magnetic moment to process into an x-y plane; when the atomic magnetic moment is in the x-y plane: when a time interval between two radio frequency $\pi/2$ pulse signals is $n/f_0$, a second $\pi/2$ pulse completes complete the Zeeman transition of magnetic resonance; when the time interval between two radio frequency $\pi/2$ pulse signals is $(m-0.5)/f_0$, the second $\pi/2$ pulse stops and reverses the Zeeman transition of magnetic resonance; when the atomic magnetic moment is in the x-y plane, a radio frequency $\pi$ pulse signal causes the atomic magnetic moment to finally return to the x-y plane; and the time interval $n/f_0$ or $(m-0.5)/f_0$ between the two radio frequency $\pi/2$ pulse signals corresponds to the condition that the atomic magnetic moment freely precesses around the background magnetic field by $2n\pi$ or $(2m-1)\pi$ radians, respectively, wherein n and m are positive integers.

2. The experimental apparatus for regulating and controlling the Zeeman transition of magnetic resonance according to claim 1, wherein when $f_0$ is 10 kHz, n is set to be 5, and m is set to be 6; i is set to be 5; and an initial phase of all sinusoidal radio frequency pulse signals is set to be zero.

3. The experimental apparatus for regulating and controlling the Zeeman transition of magnetic resonance according to claim 1, wherein the background magnetic field generating component comprises a magnetic shielding cylinder, a background magnetic field coil, and a constant current source; wherein the magnetic shielding cylinder is configured to shield a geomagnetic field; the background magnetic field coil is axially symmetrically placed inside the magnetic shielding cylinder, and the constant current source applies a constant current to the background magnetic field coil to generate a uniform and stable background magnetic field inside the magnetic shielding cylinder in an axial direction.

4. The experimental apparatus for regulating and controlling the Zeeman transition of magnetic resonance according to claim 3, wherein the constant current source uses a 6.5-bit commercial digital current source.

5. The experimental apparatus for regulating and controlling the Zeeman transition of magnetic resonance according to claim 1, wherein a magnetic field gradient of the background magnetic field is less than 1%.

6. The experimental apparatus for regulating and controlling the Zeeman transition of magnetic resonance according to claim 1, wherein a z-axis circularly polarized pump laser of the pump-probe atomic magnetometer uses a divergent beam of less than 10° to irradiate the rubidium cell.

7. The experimental apparatus for regulating and controlling the Zeeman transition of magnetic resonance according to claim 1, wherein a frequency of the z-axis circularly polarized pump laser of the pump-probe rubidium atomic magnetometer is locked to D1 line transition of a $^{87}$Rb atom, and a frequency of x-axis and z-axis polarization detection lasers is red-detuned by 3 GHz to 10 GHz compared with a frequency of the pump laser.

8. A method for regulating and controlling the Zeeman transition of magnetic resonance of the experimental apparatus according to claim 1, comprising the steps of:
    Step 1, setting the pump-probe atomic magnetometer in a magnetic field measurement mode; setting a frequency of a radio frequency pulse signal output by the radio frequency signal source in the pump-probe atomic magnetometer to be f, and an initial phase of the radio frequency pulse signal output by the radio frequency signal source in the pump-probe atomic magnetometer to be a fixed value; and fine-tuning parameters of the background magnetic field generating component by monitoring a Larmor precession frequency $f_0$ output by the pump-probe atomic magnetometer, so that the Larmor precession frequency $f_0$ corresponding to the background magnetic field is strictly equal to the frequency f of the radio frequency pulse signal;

Step 2, setting a duration of a first radio frequency pulse signal output by the radio frequency signal source in the pump-probe atomic magnetometer to be longer than a preset $\pi$ pulse duration, adjusting an amplitude of the sinusoidal signal output by the radio frequency signal source in the pump-probe atomic magnetometer, and determining a duration of the $\pi/2$ pulse or the $\pi$ pulse corresponding to the Zeeman transition of magnetic resonance by observing an x-axis differential detection signal, so that a duration $t_{\pi/2}$ of the $\pi/2$ pulse of the radio frequency signal conform to the expression: $f_0 \times t_{\pi/2} = i$, wherein a duration corresponding to an envelope is the duration of the $\pi$ pulse; and Step 3, setting the radio frequency signal source in the pump-probe atomic magnetometer to output a series of radio frequency pulse strings, wherein a first radio frequency pulse output by the radio frequency signal source is a $\pi/2$ pulse after a z-axis circularly polarized pump laser in the pump-probe atomic magnetometer is turned off, and a time interval between two radio frequency pulses is $n/f_0$ or $(m-0.5)/f_0$, and observing the Zeeman transition of magnetic resonance by using the z-axis polarized light detection component; and adjusting the pulse time interval between radio frequency pulse signals to regulate and control the Zeeman transition of magnetic resonance.

* * * * *